(12) United States Patent
Chang

(10) Patent No.: US 7,503,781 B2
(45) Date of Patent: Mar. 17, 2009

(54) SOCKET CONNECTOR ASSEMBLY WITH PICK-UP CAP

(75) Inventor: Chun-Yi Chang, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/079,844

(22) Filed: Mar. 27, 2008

(65) Prior Publication Data

US 2008/0242138 A1   Oct. 2, 2008

(30) Foreign Application Priority Data

Mar. 27, 2007   (CN) .................. 2007 2 0035738

(51) Int. Cl.
*H01R 13/44* (2006.01)
(52) U.S. Cl. .................... 439/135; 439/940
(58) Field of Classification Search ................ 439/135, 439/136, 940, 41
See application file for complete search history.

(56) References Cited

U.S. PATENT DOCUMENTS

| | | | |
|---|---|---|---|
| 6,478,588 B1 * | 11/2002 | Howell et al. ............... | 439/135 |
| 6,875,022 B2 * | 4/2005 | Ma ............................. | 439/41 |
| 6,945,799 B2 * | 9/2005 | Huang ........................ | 439/135 |
| 7,004,768 B2 | 2/2006 | Ma et al. | |
| 7,029,295 B2 | 4/2006 | Liao | |
| 7,140,890 B1 * | 11/2006 | Ju ............................... | 439/135 |
| 2007/0232114 A1 | 10/2007 | Hsieh et al. | |
| 2008/0153330 A1 * | 6/2008 | Minich ........................ | 439/135 |

\* cited by examiner

*Primary Examiner*—Hien Vu
(74) *Attorney, Agent, or Firm*—Wei Te Chung

(57) ABSTRACT

A socket connector assembly (10) comprises an insulative housing (10) comprising a bottom conductive section (201) defining a plurality of contact-receiving slots and four sidewalls (202) extending upwardly from edges of the conductive section, and a pick-up cap (30) assembled to the insulative housing and comprising a smooth top surface (301) adapted for being sucked by a vacuum device and opposite contacting surface (302). At least one of the sidewalls of the insulative housing and the pick-up cap defines at least a pair of aligning posts (303) at opposite corners thereof, and at least one of the pick-up cap and the sidewalls of the insulative housing defines a pair of aligning slots (203) at opposite corners thereof to interferentially receive the aligning posts to assemble the pick-up cap to the insulative housing.

4 Claims, 4 Drawing Sheets

SOCKET CONNECTOR ASSEMBLY WITH PICK-UP CAP

CROSS-REFERENCE TO RELATED APPLICATIONS

This application is related to U.S. patent application Ser. No. 11/732759 filed on Mar. 4, 2007 and entitled "ELECTRICAL CONNECTOR ASSEMBLY WITH PICK UP CAP", which has the same assignee as the present invention.

BACKGROUND OF THE INVENTION

1. Field of the Invention

The present invention generally relates to a socket connector assembly, and more particularly to a CPU (Central Processing Unit) socket connector assembly.

2. Description of Related Art

With the rapid development of electronic components, vacuum technology and SMT (Surface Mount Technology) are widely sued to mechanical mount process of different kinds of electronic components. The process is usually positioning a pick-up cap to an electronic component to be mounted to a printed circuit board, then absorbing the pick-up cap via vacuum nozzle to move the pick-up cap and the electronic component to the printed circuit board.

LGA (Land Grid Array) connector used to electrically connect a CPU (Central Processing Unit) to a PCB (Printed Circuit Board) is a kind of electronic component needing a pick-up cap to be positioned to the PCB accurately. When the manufacture of the LGA connector is finished, a pick-up cap is assembled to the LGA connector and is absorbed by a vacuum nozzle of a vacuum device to be placed to a predetermined position of the PCB for assembling the connector to the PCB. The engagement means between the LGA connector and the pick-up cap is usually realized by latches of the pick-up cap latching outer periphery of the LGA connector which occupies a relative large space on the PCB. However, the space on the PCB is very limited and the circuits on the PCB are very complex. It is glad to see each electronic component assembled on the PCB occupies reduced space and without interference with adjacent electronic components.

Therefore, it is desired to provide an improved socket connector assembly to stress the problems mentioned above.

BRIEF SUMMARY OF THE INVENTION

Accordingly, an object of the present invention is to provide a socket connector assembly with improved pick-up cap with spare occupied space for preventing interference with other electronic component.

In order to achieve the above-mentioned object, a socket connector assembly comprises an insulative housing comprising a bottom conductive section defining a plurality of contact-receiving slots and four sidewalls extending upwardly from edges of the conductive section, and a pick-up cap assembled to the insulative housing and comprising a smooth top surface adapted for being sucked by a vacuum device and opposite contacting surface. At least one of the sidewalls of the insulative housing and the pick-up cap defines at least a pair of aligning posts at opposite corners thereof, and at least one of the pick-up cap and the sidewalls of the insulative housing defines a pair of aligning slots at opposite corners thereof to interferentially receive the aligning posts to assemble the pick-up cap to the insulative housing.

Other objects, advantages and novel features of the invention will become more apparent from the following detailed description of the present embodiment when taken in conjunction with the accompanying drawings.

DETAILED DESCRIPTION OF THE INVENTION

Figure 1:
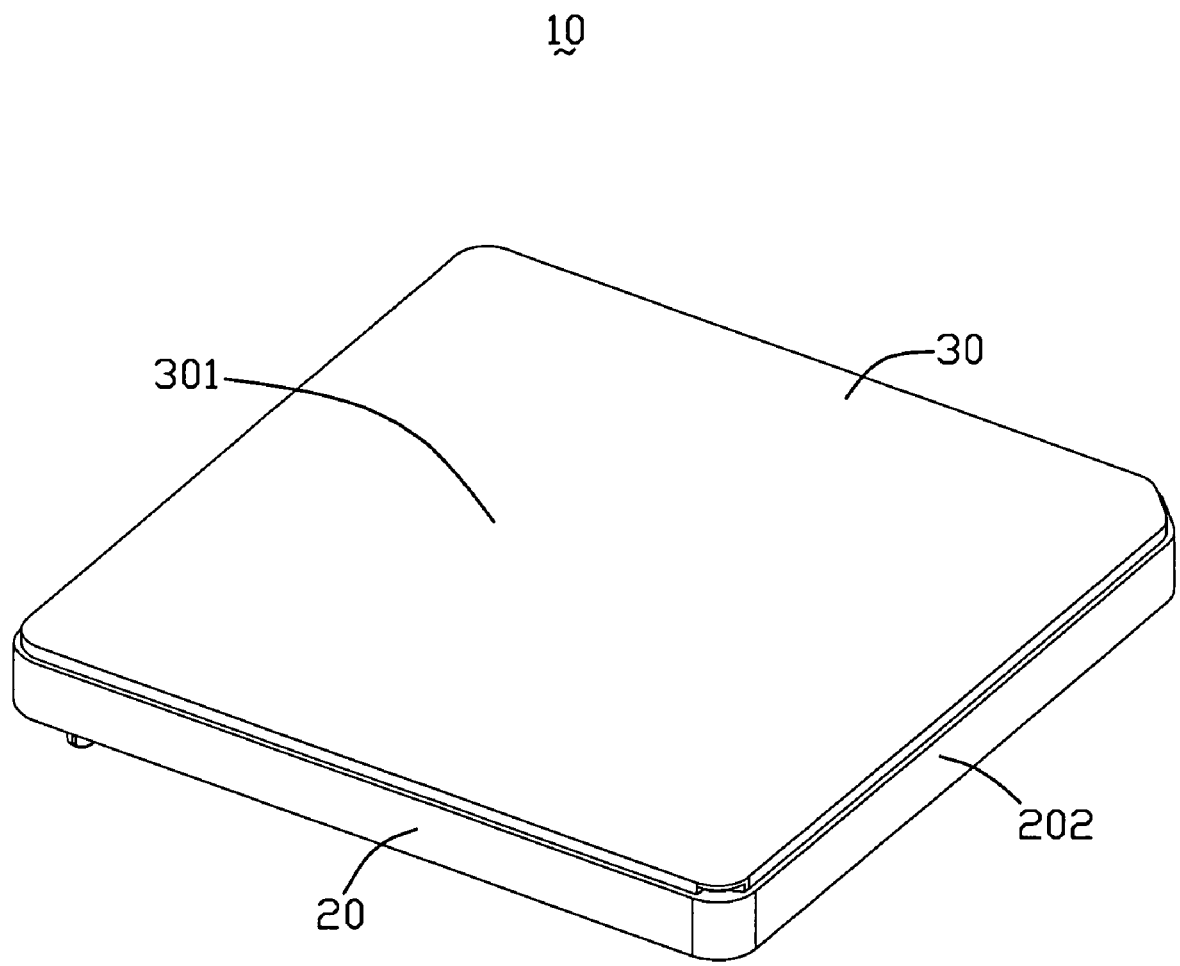
FIG. 1 is an assembled, perspective view of a socket connector assembly of the present invention.

Reference will now be made to the drawing figures to describe the present invention in detail.

Figure 2:
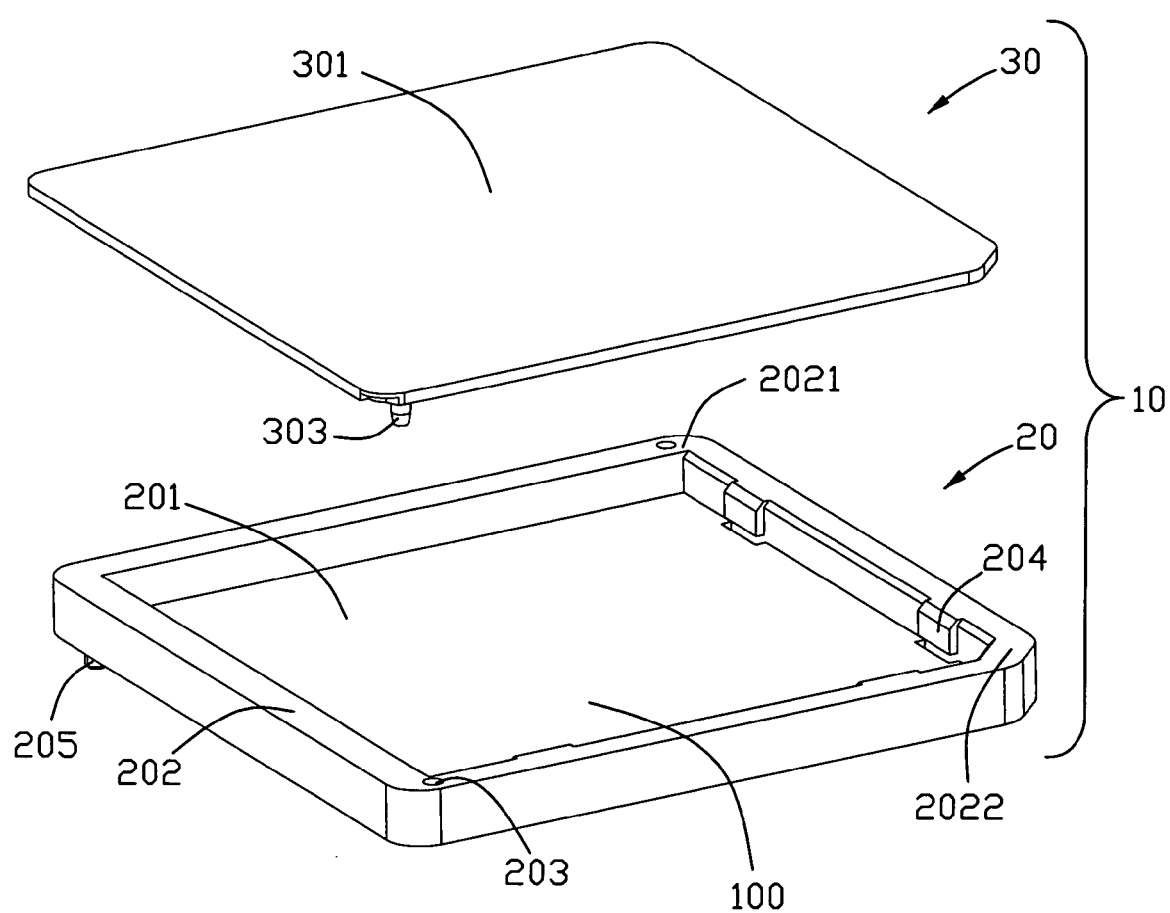
FIG. 2 is an exploded, perspective view of the socket connector assembly shown in FIG. 1.
Figure 3:
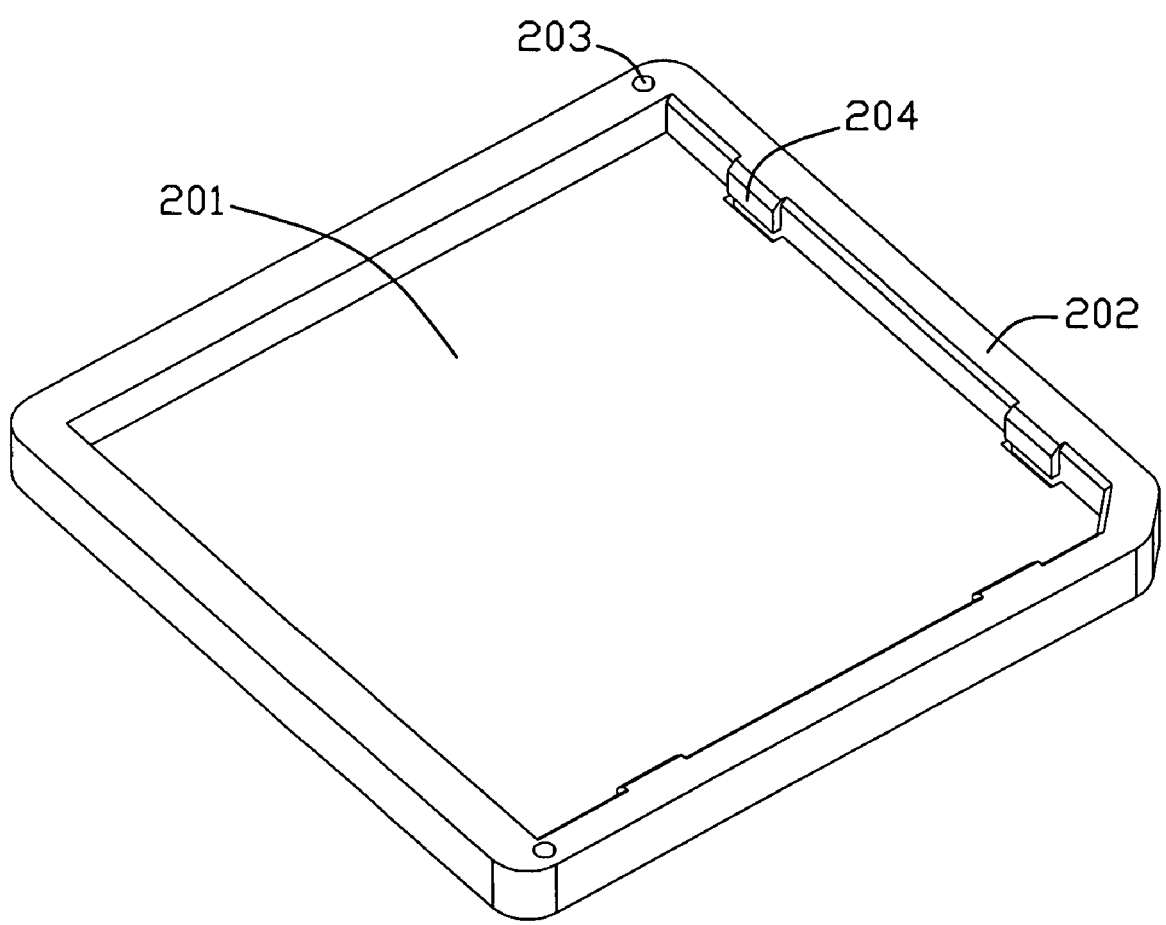
FIG. 3 is a perspective view of a pick-up cap of the socket connector assembly.
Figure 4:
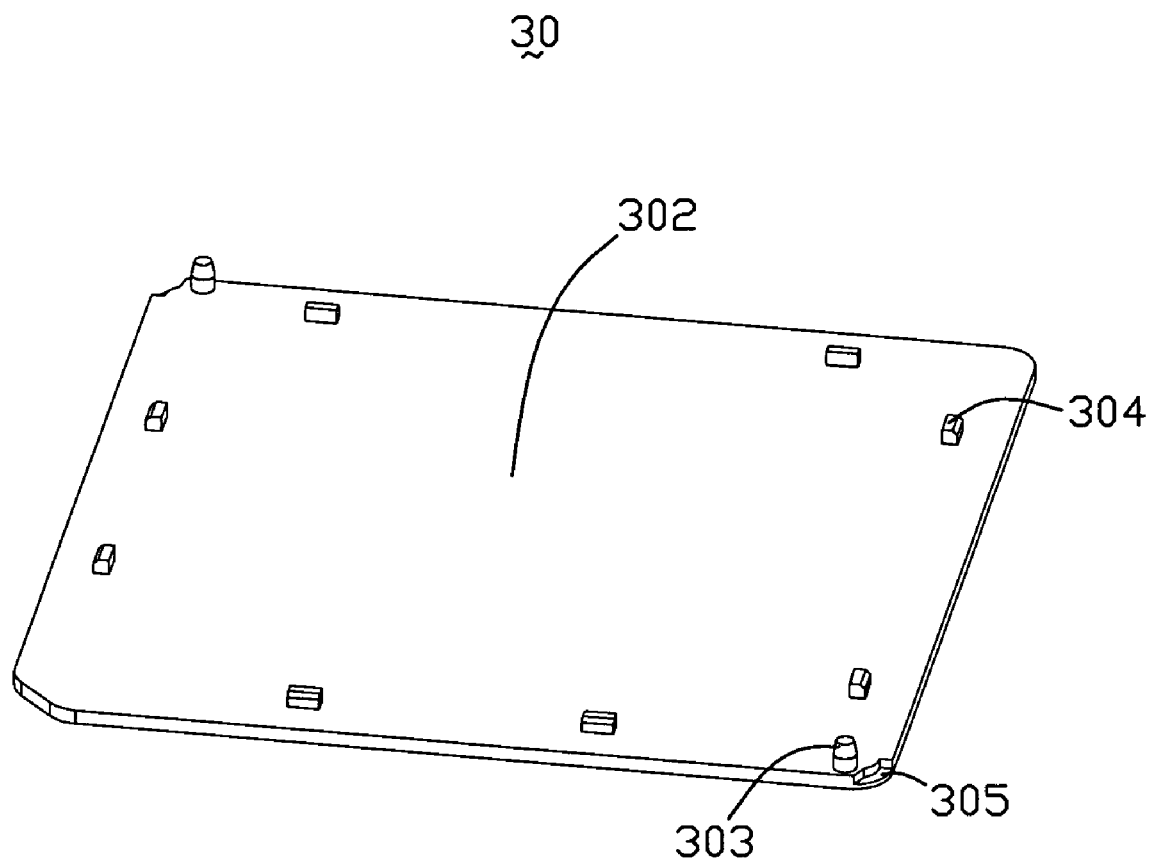
FIG. 4 is a perspective view of an insulative housing of the socket connector assembly.

Please refer to FIGS. 1-2, a socket connector assembly 10 in accordance with the present invention comprises an insulative housing 20, a plurality of contacts (not shown) accommodated in the insulative housing 20, and a pick-up cap 30 assembled to the insulative housing 10 to protect the contacts and being absorbed by a vacuum device to move the socket connector assembly 10 to a predetermined position of a PCB (Printed Circuit Board, not shown).

The insulative housing 20 is of rectangular shape and comprises a bottom flat conductive section 201 and four sidewalls 202 extending upwardly from four edges of the conductive section 201 to form a receiving space 100 together with the conductive section 201 for receiving a CPU (Central Processing Unit). The conductive section 201 defines a plurality of contact-receiving slots (not shown) for receiving the contacts (not shown). Two adjacent sidewalls 202 of the four sidewalls 202 each forms a pair of data 204 protruding into the receiving space 100 to serve as a datum plane for positioning the CPU. Two opposite corners 2021 define a pair of aligning slots 203 extending downwardly from a top surface of the sidewalls 202 a certain distance. The other two opposite corners 2022 forms a pair of positioning posts 205 depending downwardly from a bottom surface of the sidewalls 202.

The pick-up cap 30 is a flat board and comprises a smooth top surface 301 and opposite contacting surface 302. Corresponding to the aligning slots 203, the pick-up cap 30 forms a pair of aligning posts 303 interferentially received in the aligning slots 203. The pick-up cap 30 forms a plurality of projections 304 pressed into the receiving space 100 of the insulative housing 20 closely abutting against inner surfaces of the sidewalls 202. The pick-up cap 30 also defines a pair of disengage recesses 305 extending upwardly from the contacting surface 302 a certain distance with irregular shape. The disengage recesses 305 are located adjacent to corresponding aligning posts 303. Each aligning post 303 is tapered at a bottom end thereof for facilitating the insertion into the aligning slots 203.

In assembly, the contacts are assembled to the contact-receiving slots of the insulative housing 20. Then the pick-up cap 30 is assembled to the insulative housing 20 with the aligning posts 303 pressed into the aligning slots 203, the projections 304 received into the receiving space 100. The pair of disengage recesses 305 are used to separate the pick-up cap 30 from the insulative housing 20 conveniently. After assembly, the pick-up cap 30 is seated on the upper surface of the sidewalls 202 without any part extending beyond the insulative housing 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket connector assembly, comprising:
   an insulative housing comprising a bottom conductive section defining a plurality of contact-receiving slots and four sidewalls extending upwardly from edges of the conductive section;
   a pick-up cap assembled to the insulative housing and comprising a smooth top surface adapted for being sucked by a vacuum device and opposite contacting surface formed with a plurality of downward protrusions to engage interior surfaces of the sidewalls; and wherein at least one of the sidewalls of the insulative housing and the pick-up cap defines at least a pair of aligning posts at opposite corners thereof, and at least one of the pick-up cap and the sidewalls of the insulative housing defines a pair of aligning slots at opposite corners thereof to interferentially receive the aligning posts to assemble the pick-up cap to the insulative housing;
   wherein the aligning posts extend downwardly from the contacting surface of the pick-up cap, and wherein the aligning slots are defined in the sidewalls of the insulative housing;
   wherein the insulative housing forms a pair of positioning posts extending downwardly from the sidewalls at the other two opposite corners;
   wherein the pick-up cap defines a pair of disengage recesses on the contact surface at the corners of the plate adjacent to the pair of aligning posts for separating the pick-up cap from the insulative housing conveniently.

2. The socket connector assembly as claimed in claim 1, wherein the contacting surface of the pick-up cap contacts the sidewalls of the insulative housing without any part extending beyond the insulative housing.

3. An electrical connector assembly comprising:
   an insulative housing defining a base wall, with a plurality of contacts therein, and a plurality of side walls commonly defining an upward receiving cavity;
   a pair of aligning holes defined in an upper face of said side walls;
   a pick-up cap defining a plate configured not exceeding that defined by said side walls while completely covering the receiving cavity; wherein
   said pick-up cap have downward posts interferential received in said holes;
   wherein a plurality of downward protrusions formed on an underside of the plate to engage interior faces of the corresponding side walls for enhancing retention of said pick-up cap to the housing;
   wherein said hole is located in a corner of the housing, and said post is located at a corner of the plate;
   wherein a recess is formed on said underside at said corner of the plate adjacent to the post for facilitating removal of the pick-up cap from the housing.

4. The electrical connector assembly as claimed in claim 3, wherein said downward protusions surround said receiving cavity and are engaged with all said side walls, respectively.

* * * * *